(12) United States Patent  (10) Patent No.: US 8,410,830 B2
Mahdavi  (45) Date of Patent: Apr. 2, 2013

(54) INJECTION LOCKED FREQUENCY DIVIDER AND ASSOCIATED METHODS

(75) Inventor: Shahram Mahdavi, Sunnyvale, CA (US)

(73) Assignee: Silicon Laboratories Inc., Austin, TX (US)

( * ) Notice: Subject to any disclaimer, the term of this patent is extended or adjusted under 35 U.S.C. 154(b) by 210 days.

(21) Appl. No.: 12/770,383

(22) Filed: Apr. 29, 2010

(65) Prior Publication Data

US 2010/0277207 A1 Nov. 4, 2010

Related U.S. Application Data

(60) Provisional application No. 61/215,347, filed on May 2, 2009.

(51) Int. Cl.
*H03B 19/06* (2006.01)

(52) U.S. Cl. ............ 327/118; 327/117; 327/120; 377/47

(58) Field of Classification Search .................. 327/115, 327/116, 117, 118, 355–361, 202, 203, 208–212, 327/218; 377/47, 48

See application file for complete search history.

(56) References Cited

U.S. PATENT DOCUMENTS

| | | | | |
|---|---|---|---|---|
| 6,191,623 | B1* | 2/2001 | Gabara | 327/71 |
| 6,828,844 | B2* | 12/2004 | Suzuki et al. | 327/359 |
| 7,557,664 | B1* | 7/2009 | Wu | 331/51 |
| 7,656,205 | B2* | 2/2010 | Chen et al. | 327/115 |
| 2003/0199259 | A1* | 10/2003 | Macedo et al. | 455/141 |
| 2008/0278204 | A1* | 11/2008 | Jang et al. | 327/118 |
| 2009/0085682 | A1* | 4/2009 | Jang et al. | 331/117 FE |
| 2009/0184739 | A1* | 7/2009 | Chen et al. | 327/115 |
| 2009/0261868 | A1* | 10/2009 | Lu et al. | 327/118 |
| 2009/0289687 | A1* | 11/2009 | Lai | 327/355 |

\* cited by examiner

*Primary Examiner* — Lincoln Donovan
*Assistant Examiner* — Brandon S Cole
(74) *Attorney, Agent, or Firm* — Trop, Pruner & Hu, P.C.

(57) ABSTRACT

An apparatus includes an injection locking frequency divider, which includes a first resonant tank that has a first resonance frequency and a common mode path that includes a second resonant tank, and has a second resonance frequency that is a harmonic of the first resonance frequency. The second resonant tank is adapted to receive a first signal having an oscillation frequency near the harmonic of the first resonance frequency to cause the first resonant tank to provide a second signal that is locked to the first signal.

18 Claims, 7 Drawing Sheets

INJECTION LOCKED FREQUENCY DIVIDER AND ASSOCIATED METHODS

This application claims the benefit under 35 U.S.C. §119 (e) to U.S. Provisional Patent Application Ser. No. 61/215,347, filed May 2, 2009, entitled, "LOW POWER SYSTEMS AND METHODS TO BOOST AND CONTROL LOCKING RANGE OF INJECTION LOCKED DIVIDERS," which is hereby incorporated by reference in its entirety.

BACKGROUND

The invention generally relates to an injection locked frequency divider and associated methods.

Prescalers, or frequency dividers, typically are key building blocks in wire line and radio transceivers. As its name implies, a typical frequency divider divides the frequency of a periodic input signal to produce a periodic output signal, which has a frequency that is an integer fraction of the frequency of the input signal.

A typical frequency divider may be formed from digital components, such as counters and/or shift registers. The power that is dissipated by these components, and thus, the power dissipated by a frequency divider formed from such components, typically increases with frequency.

SUMMARY

In an exemplary embodiment of the invention, an apparatus includes an injection locking frequency divider, which includes a first resonant tank that is associated with a resonance frequency and a secondary resonant tank that is a harmonic of the resonance frequency. The second resonant tank has a node that is adapted to receive a first signal that has an oscillation frequency near the harmonic to cause the first resonant tank to provide a second signal that is locked to the first signal.

In another exemplary embodiment of the invention, a technique includes generating an oscillation in a primary resonant tank of an oscillator to produce an output signal. The oscillation produces at least one harmonic in a secondary resonant tank of the oscillator, and the technique includes injecting an input signal into a node of the secondary resonant tank to synchronize the output signal to the input signal.

Advantages and other features of the invention will become apparent from the following drawing, description and claims.

DETAILED DESCRIPTION

Figure 1:
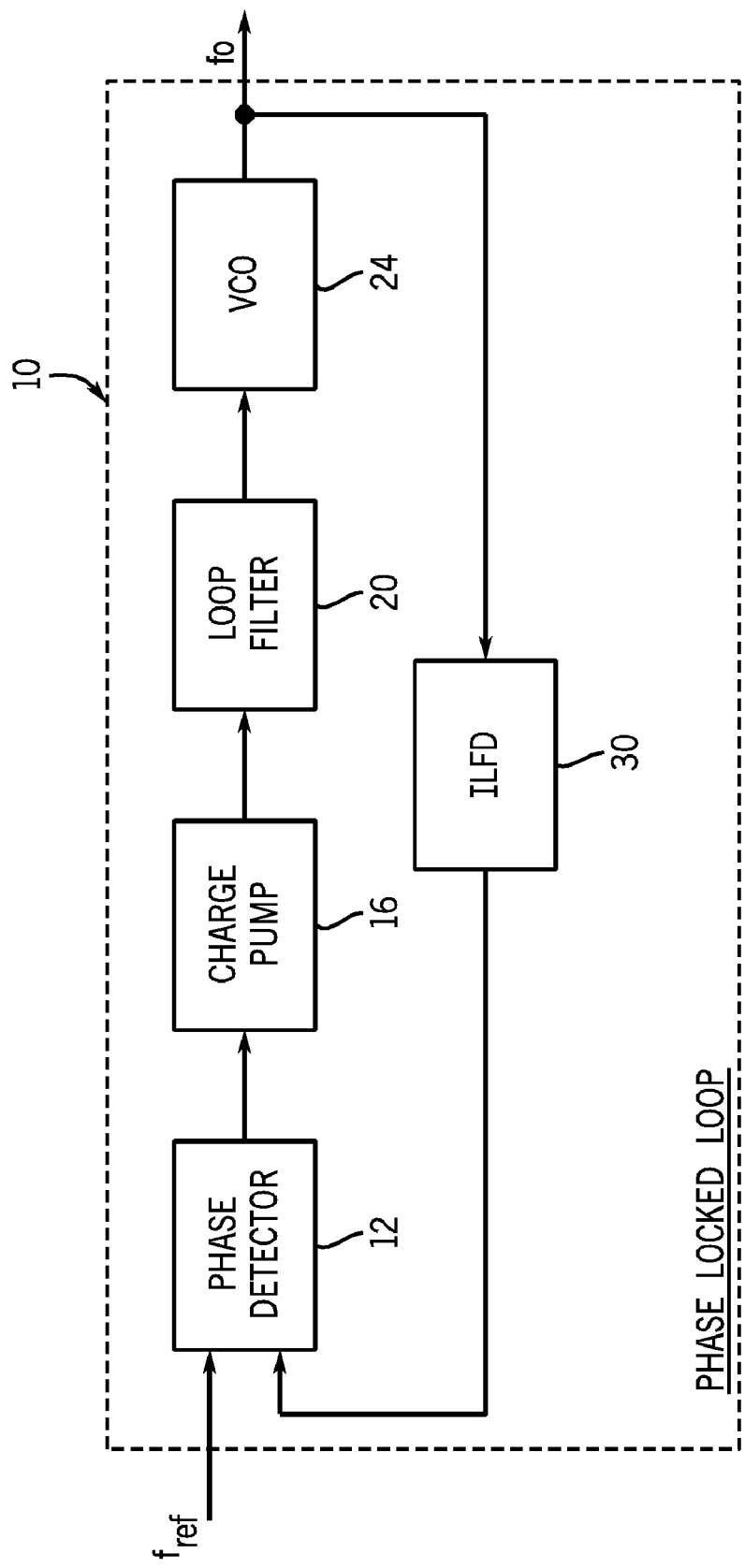
FIG. 1 is a schematic diagram of a phase locked loop according to an exemplary embodiment of the invention.

An injection locked frequency divider (ILFD) in accordance with embodiments of the invention described herein generates a frequency-divided output signal in response to a relatively higher frequency input signal. As compared to digital dividers, the ILFD dissipates relatively little power at relatively high frequencies (gigahertz (GHz) frequencies, for example) and locks its output signal relatively quickly to the input signal. In this context, the "locking" of the output signal to the input signal means that the input signal has a frequency that is generally a harmonic (an even or odd harmonic) of the output signal, and the phases of these two signals are synchronized to one another.

The ILFD includes a nonlinear harmonic oscillator, which is forced into a given oscillation state by the ILFD's periodic input signal through a type of forced oscillation called, "injection locking." In the absence of the input signal, the harmonic oscillator naturally oscillates at a natural resonance frequency due to the exchange of energy between an inductor and a capacitor in a main resonant tank of the oscillator. Injection locking is a type of forced oscillation for a nonlinear oscillator, in which a perturbation drives the oscillator's main resonant tank from its natural resonance frequency state to cause the tank to oscillate at another frequency. When the perturbation is a periodic signal that has a slightly different frequency than the resonance frequency, then the harmonic oscillator is forced to oscillate at the periodic signal's frequency and in general, become locked to the periodic signal.

More particularly, a time varying periodic injection current, called "$I_{inj}(t)$," may be introduced into a nonlinear harmonic oscillator to cause the oscillator to lock to the $I_{inj}(t)$ injection current under certain conditions. As a specific example, the $I_{inj}(t)$ injection current may be a sinusoidal signal, which has a fundamental frequency that deviates by a relatively small amount (denoted by "$\Delta\omega$") from the natural resonance frequency (called "$\omega_o$") of the oscillator, as described below:

$$I_{inj}(t) = I_{inj} \sin((\omega_o + \Delta\omega)t), \qquad \text{Eq. 1}$$

where "$I_{inj}$" represents the magnitude of the injection current. When the $\Delta\omega$ frequency deviation is within a locking range of the harmonic oscillator, the oscillator locks to the $I_{inj}(t)$ injection current. The extent, or range, of the $\Delta\omega$ frequency deviation, which allows locking to occur may be described on one side of the $\omega_o$ natural resonance frequency, as follows:

$$\Delta\omega \alpha \frac{\omega_o}{Q} \cdot \frac{I_{inj}}{I_{osc}} \frac{1}{\sqrt{1 - \left(\frac{I_{inj}}{I_{osc}}\right)^2}}, \qquad \text{Eq. 2}$$

where "$I_{osc}$" represents the magnitude of the oscillating current in the main resonant tank of the oscillator. When the $I_{inj}$ injection current magnitude is less than the $I_{osc}$ oscillating current magnitude, the $\Delta\omega$ deviating frequency may be approximated as follows:

$$\Delta\omega \alpha \frac{\omega_o}{Q} \cdot \frac{I_{inj}}{I_{osc}}. \qquad \text{Eq. 3}$$

Injection locking may also occur when the fundamental frequency of the $I_{inj}(t)$ injection current is near a harmonic or sub-harmonic of the $\omega_o$ natural resonance frequency of the harmonic oscillator.

FIG. 1 illustrates a potential application of an injecting locked frequency divider (ILFD) 30 in accordance with an exemplary embodiment of the invention. For this non-limiting example, the ILFD 30 is part of a phase locked loop (PLL) 10. The PLL 10 receives a periodic reference signal that has a frequency (called "$f_{ref}$" in FIG. 1) and produces a corresponding output signal that is locked onto the reference signal and has a frequency called "$f_o$" in FIG. 1.

As shown in FIG. 1, for this example, the PLL 10 incorporates the ILFD 30 into a feedback path of the PLL 10. More specifically, the PLL 10 includes a voltage controlled oscillator (VCO) 24, which produces the output signal. The output signal is supplied to the ILFD 30 to create an injection current in the ILFD 30 and the ILFD 30 divides the $f_o$ frequency to produce a correspondingly lower frequency signal that is provided to a phase detector 12 of the PLL 10. The phase detector 12 produces a signal that is indicative of the phase difference between the reference signal and the signal that is provided by the ILFD 30, and controls a charge pump 16 accordingly. Thus, an output signal from the charge pump 16 indicates the phase error between the reference signal and the output signal. This controls signal passes through a loop filter 20, which produces a corresponding filtered control signal that controls the VCO 24 and, thus, controls the output signal of the PLL 10.

Figure 2:
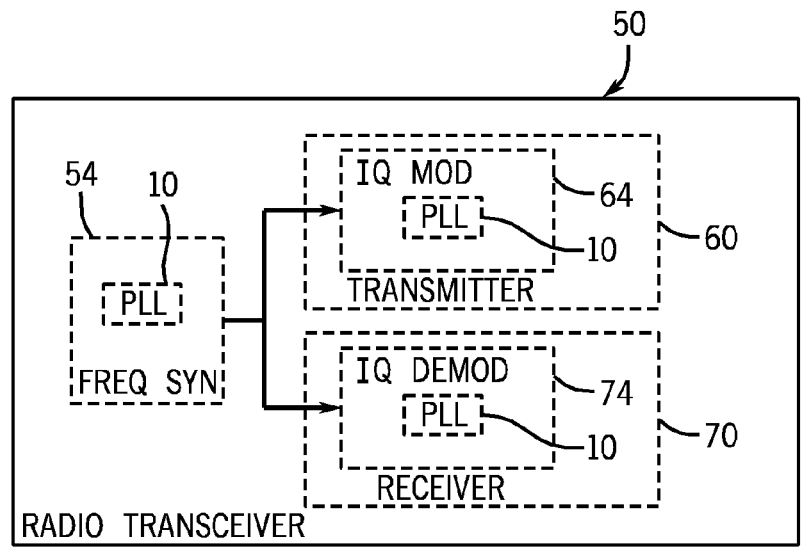
FIG. 2 is a schematic diagram of a radio transceiver according to an exemplary embodiment of the invention.

It is noted that the ILFD 30 may be used in numerous other applications. For example, when used as a part of PLL, such as the PLL 10, the ILFD 30 may be used in a frequency synthesizer 54 of a radio transceiver 50, which is depicted in FIG. 2. Furthermore, the PLL 10 may be used as part of a transmitter 60 and receiver 70 of the radio transceiver 50. As a more specific example, the PLL 10 may be part of an inline quadrature (IQ) modulator 64 of the transmitter 60 and may likewise be part of an IQ demodulator 74 of the receiver 70. The ILFD 30 may be used in various other applications, in accordance with the many potential exemplary embodiments of the invention.

Figure 3:
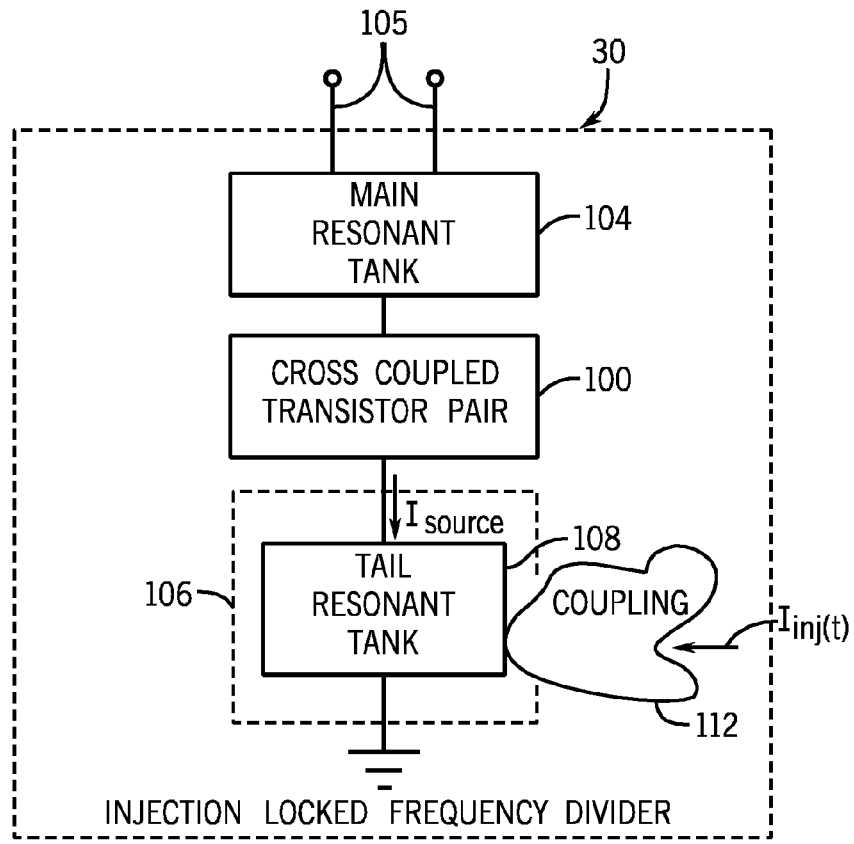
FIGS. 3, 4, 7 and 8 are schematic diagrams of injection locked frequency dividers according to exemplary embodiments of the invention.

Referring to FIG. 3, in accordance with some embodiments of the invention, the ILFD 30 contains a main resonant tank 104 that has an associated resonance frequency, which is the natural, unperturbed oscillation frequency of the ILFD 30. In this regard, the ILFD 30 naturally oscillates at the resonance frequency established by the inductor capacitor (LC) components of the main resonant tank 104 in the absence of an external perturbation. In application, however, the oscillation of the ILFD 30 is controlled by an $I_{inj}(t)$ injection current (the input signal for the ILFD 30), and the oscillation of the main resonant tank locks to the $I_{inj}(t)$ injection current to produce the ILFD's output signal. The ILFD's output signal is a sinusoidal signal that appears across the ILFD's output terminals 105 that are coupled to the main resonant tank 104.

For this example, the ILFD 30 is a cross-coupled inductor capacitor (LC) oscillator; and as such, the main resonant tank 104 is coupled to a cross-coupled transistor pair 100. As described further below, the oscillating operation of the ILFD 30 produces a harmonic current (called "$I_{source}(t)$" herein) which propagates along a common mode path 106 of the ILFD 30.

More specifically, in accordance with the exemplary embodiments of the invention described herein, the ILFD 30 includes a secondary resonant tank 108 (called the "tail resonant tank 108" herein), which is coupled in the common mode path 106, and as such, harmonic energy is exchanged between the LC components of the resonant tank 108. Because the cross-coupled transistor pair 100 sources harmonic energy to the common mode path 106 and more particularly, to the resonant tank 108, the cross-coupled transistor pair 100 behaves as a signal source that possesses a negative resistance behavior. Due to this relationship, by setting the resonance frequency of the resonant tank 108 to a frequency near or at a harmonic of the resonant tank 104, the cross-coupled transistor pair 100 compensates for the loss that is otherwise introduced by the tail resonant tank 108.

Figure 9:
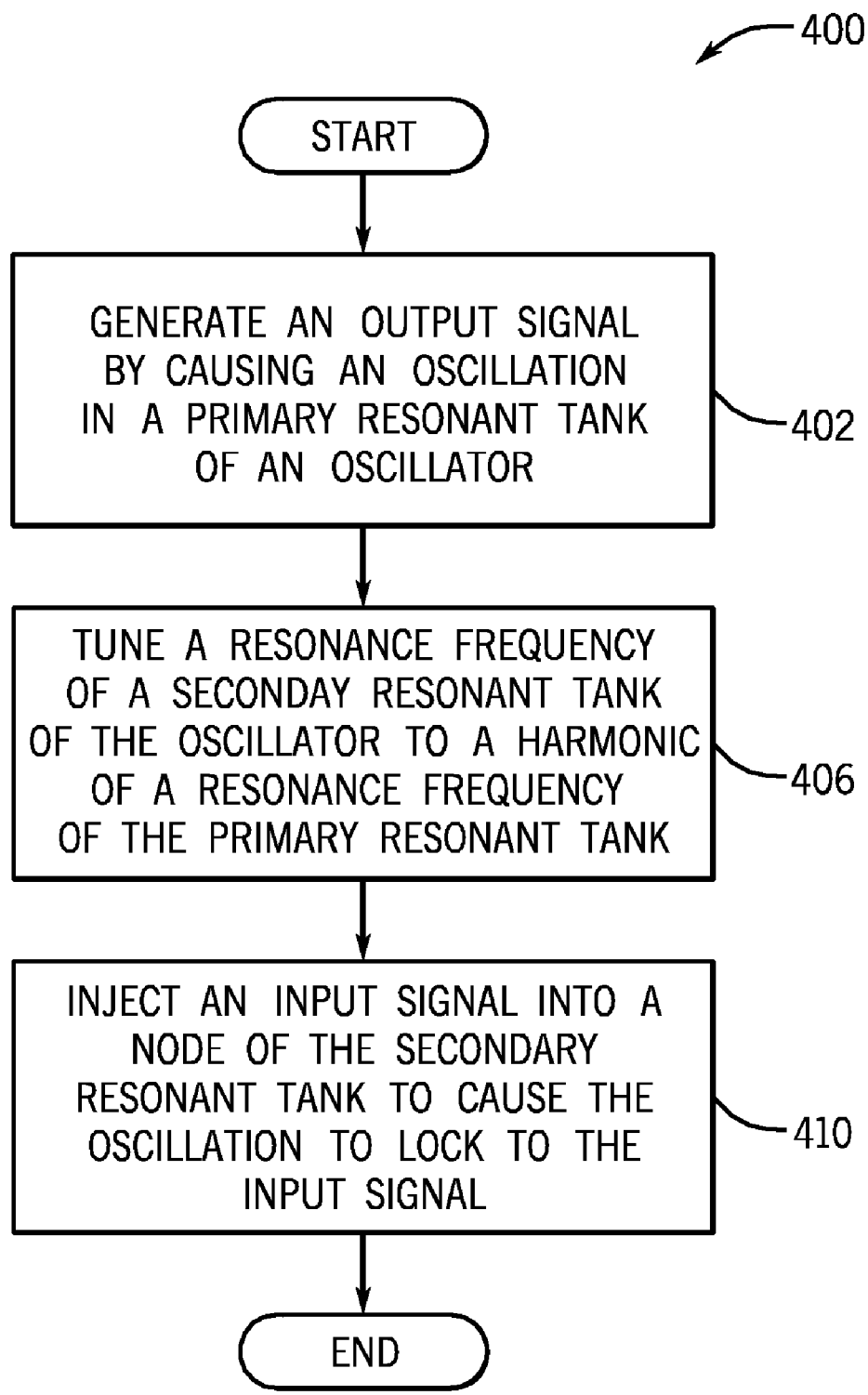
FIG. 9 is flow diagram depicting a technique to generate a frequency divided signal according to an exemplary embodiment of the invention.

Using the above-described injection locking, a technique 400 that is depicted in FIG. 9 may be performed for purposes of generating a frequency divided signal in accordance with an exemplary embodiment of the invention. Referring to FIG. 9, pursuant to the technique 400, an output signal is generated (block 402) by causing an oscillation in a primary resonant tank of an oscillator. The technique 400 includes tuning (block 406) a resonance frequency of a secondary resonant tank of the oscillator to a harmonic of the resonance frequency of the primary resonant tank. An input signal is injected (block 410) into a node of the secondary resonant tank to cause the oscillation (and thus, the oscillator's output signal) to lock to the input signal.

Figure 4:
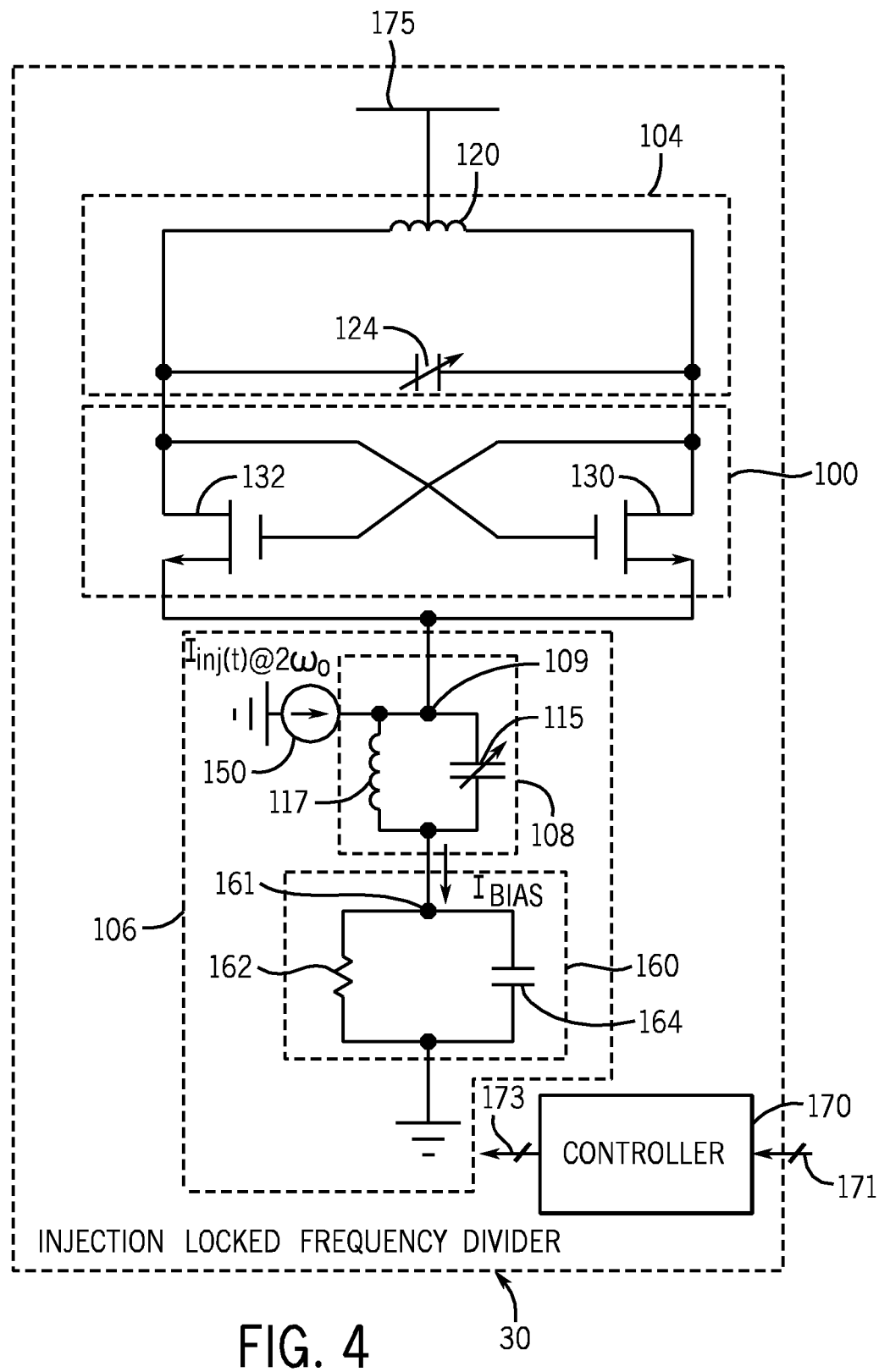

As a more specific example, FIG. 4 depicts the ILFD 30 in accordance with some embodiments of the invention. For these embodiments of the invention, the ILFD 30 has an even divide ratio. In other words, ILFD 30 evenly divides the frequency of its input signal (i.e., the $I_{inj}(t)$ injection current) to produce a signal at its output terminals 105, which has a frequency reduced by the even divisor. Thus, the frequency of the ILFD's input signal may be an even multiple of the ILFD's output signal, such as a multiple of two, four or eight, as non-limiting examples. Note that divisors other than two, four, or eight may be used, as desired.

As depicted in FIG. 4, the cross-coupled transistor pair 100 includes two cross-coupled metal oxide semiconductor field effect transistors (MOSFETs) 130 and 132, for this example. The drain terminal of each MOSFET 130, 132 is connected to the gate terminal of the other MOSFET 130, 132. Furthermore, the drain terminals of the MOSFETs 130 and 132 are coupled to opposite terminals of the main resonant tank 104, and the source terminals of the MOSFETs 130 and 132 are coupled together at a node 109 of the tail resonant tank 108.

As also depicted in FIG. 4, in accordance with some embodiments, the main resonant tank 104 includes a variable capacitor 124 (a varactor, for example) that is coupled in parallel with an inductor 120 of the tank 104. The capacitance of the variable capacitor 124 may be regulated by a controller 170 of the ILFD 30 for purposes of tuning the resonance frequency of the main resonant tank 104, in accordance with some embodiments. In this regard, the controller 170 may receive control data via input lines 171 and in response to this data generate a corresponding capacitance control signal for the capacitor 124 on one or more of the controller's output terminals 173. As also shown in FIG. 4, a center tap of the inductor 120 may be connected to a DC power supply bus 175, in accordance with some embodiments of the invention.

For the example that is depicted in FIG. 4, a current source 150 injects the $I_{inj}(t)$ injection current into the node 109 of the tail resonant tank 108. For this example, the $I_{inj}(t)$ injection current has a fundamental periodic frequency that is sufficiently close enough to the second harmonic of the resonance frequency of the main resonant tank 104 to cause the oscillation in the tank 104 to lock to the $I_{inj}(t)$ injection current.

As depicted in FIG. 4, the tail resonant tank 108 may be formed, for example, from a parallel combination of a variable capacitor 115 (a varactor, for example) and an inductor 117. In this manner, a terminal of the capacitor 115 and a terminal of the inductor 117 are connected together at the node 109; and the other terminals of the capacitor 115 and inductor 117 are coupled together at a node 161 of a bias network 160. In accordance with some embodiments, the controller 170 may via one or more of its output signals 173 regulate the capacitance of the capacitor 115 for purposes of tuning the resonance frequency of the tail resonant tank 108.

In accordance with some embodiments, the bias network 160, which may include (for example) a parallel combination of a resistor 162 and capacitor 164, establishes a corresponding bias current for the common mode path 106 called, "$I_{BIAS}$." The resistor 162 and capacitor 164 are coupled together in parallel between the node 161 and ground.

The currents that propagate in the main resonant tank 104 and through the drain-source paths of the MOSFETs 130 and 132 are generally lower frequency signals than the corresponding harmonic frequencies (second harmonic frequencies, for example), which propagate in the common mode path 106 and thus, in the tail resonant tank 108. For a $\omega_{inj}$ injection frequency of approximately twice the $\omega_o$ main resonance frequency of the main resonant tank 104, the ILFD 30 of FIG. 4 may be viewed as being equivalent to a mixer 200 that is depicted in FIG. 5.

Figure 5:
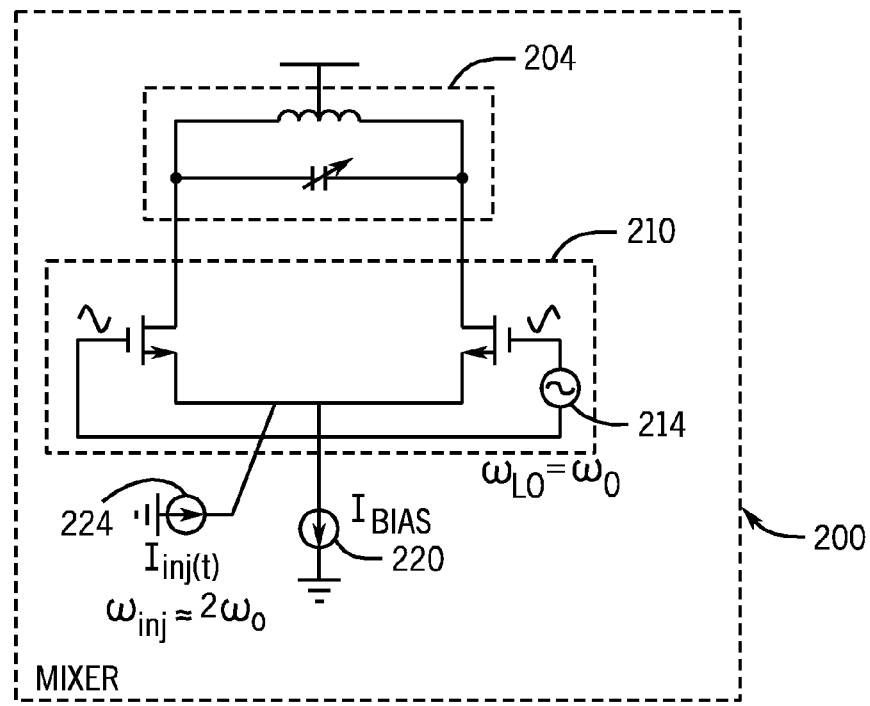
FIG. 5 is a mixer equivalent circuit for the injection locked frequency divider of FIG. 4 according to an exemplary embodiment of the invention.

As shown in FIG. 5, the mixer 200 contains a differential pair 210 of transistors. A differential source 214 is coupled across the gate terminals of these transistors and has a frequency equal to the $\omega_o$ frequency. For the mixer 200, an injection current source 224 (having a $\omega_{inj}$ injection frequency equal to two times the $\omega_o$ frequency) is injected into the source terminals of the transistors 210; and a bias current source 220, which introduces a bias current equal to $I_{BIAS}$ is also connected to the source terminals.

Figure 6:
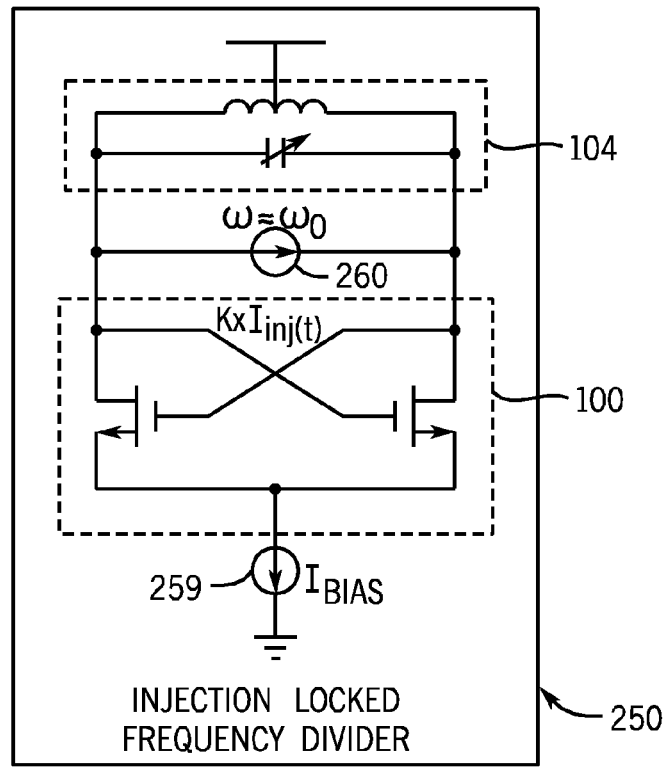
FIG. 6 is an equivalent circuit for the injection locked frequency divider of FIG. 4 illustrating the effect of injecting current into the divider according to an exemplary embodiment of the invention.

The ILFD 30 of FIG. 4 may also be viewed as being equivalent to a cross-coupled LC oscillator 250 that is depicted in FIG. 6. As shown, the oscillator 250 has a current source 259 that supplies the $I_{BIAS}$ current to the source terminals of the transistors 100, and a current source 260 injects an amplified current signal having the $\omega_o$ frequency into the main resonant tank 104.

Figure 7:
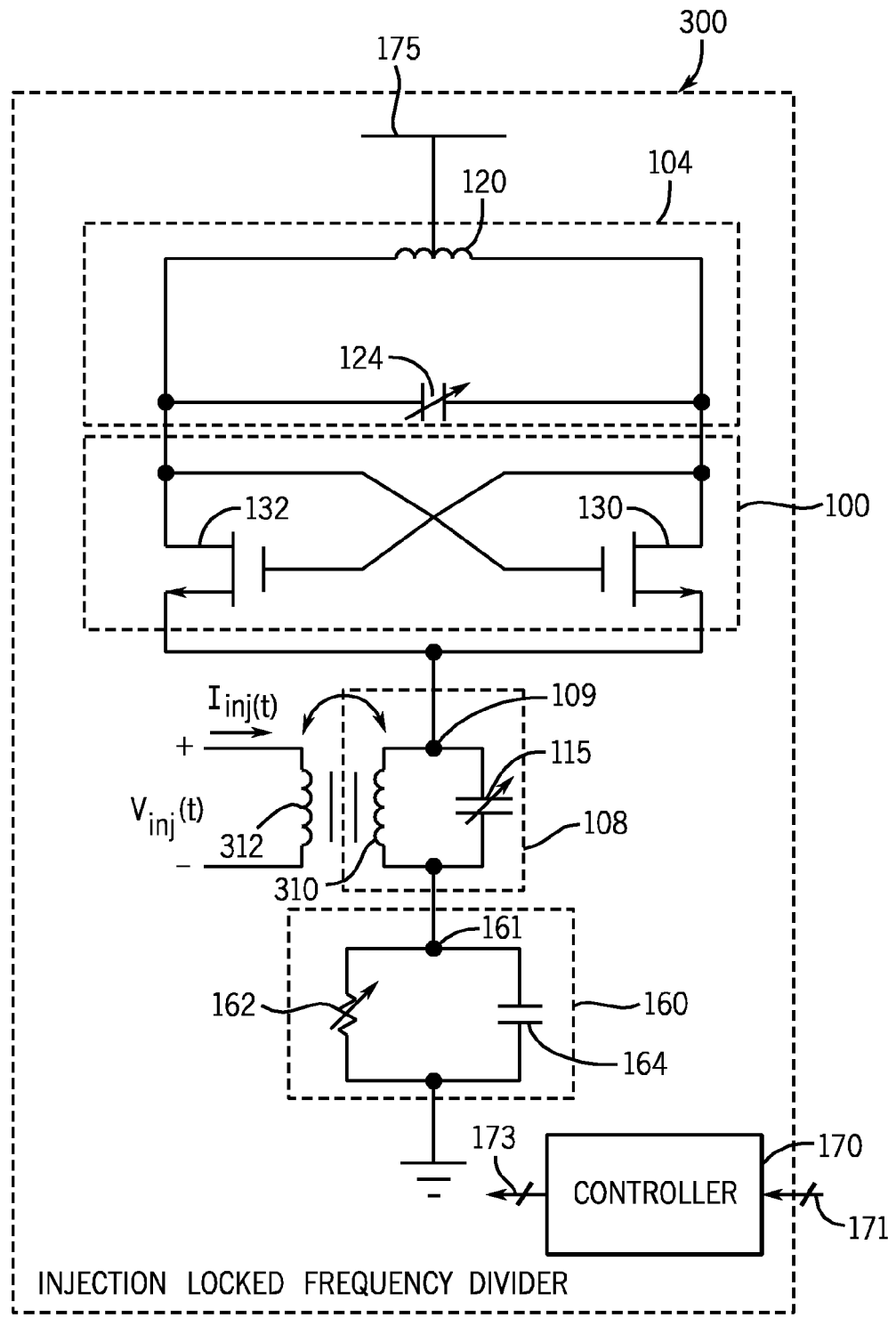

A number of different circuits (forming different couplings 112 (see FIG. 4)) may be used in exemplary embodiments to inject the $I_{inj}(t)$ injection current into the node 109, depending on desired specifications and performance criteria. For example, referring to FIG. 7, an ILFD 300 in accordance with an exemplary embodiment of the invention has an architecture that is similar to the architecture of the ILFD 30 of FIG. 4, with similar reference numerals being used to denote similar components. The ILFD 300 uses a transformer to introduce the $I_{inj}(t)$ injection current into the node 109. In this regard, for this embodiment, the tail resonant tank 108 includes a variable capacitor 115 that is connected in parallel with a secondary winding 310 of a transformer, which forms the inductor for the tank 108. The primary winding 312 of the transformer receives a periodic voltage (called "$V_{inj}(t)$" in FIG. 7) to create the $I_{inj}(t)$ injection current.

Figure 8:
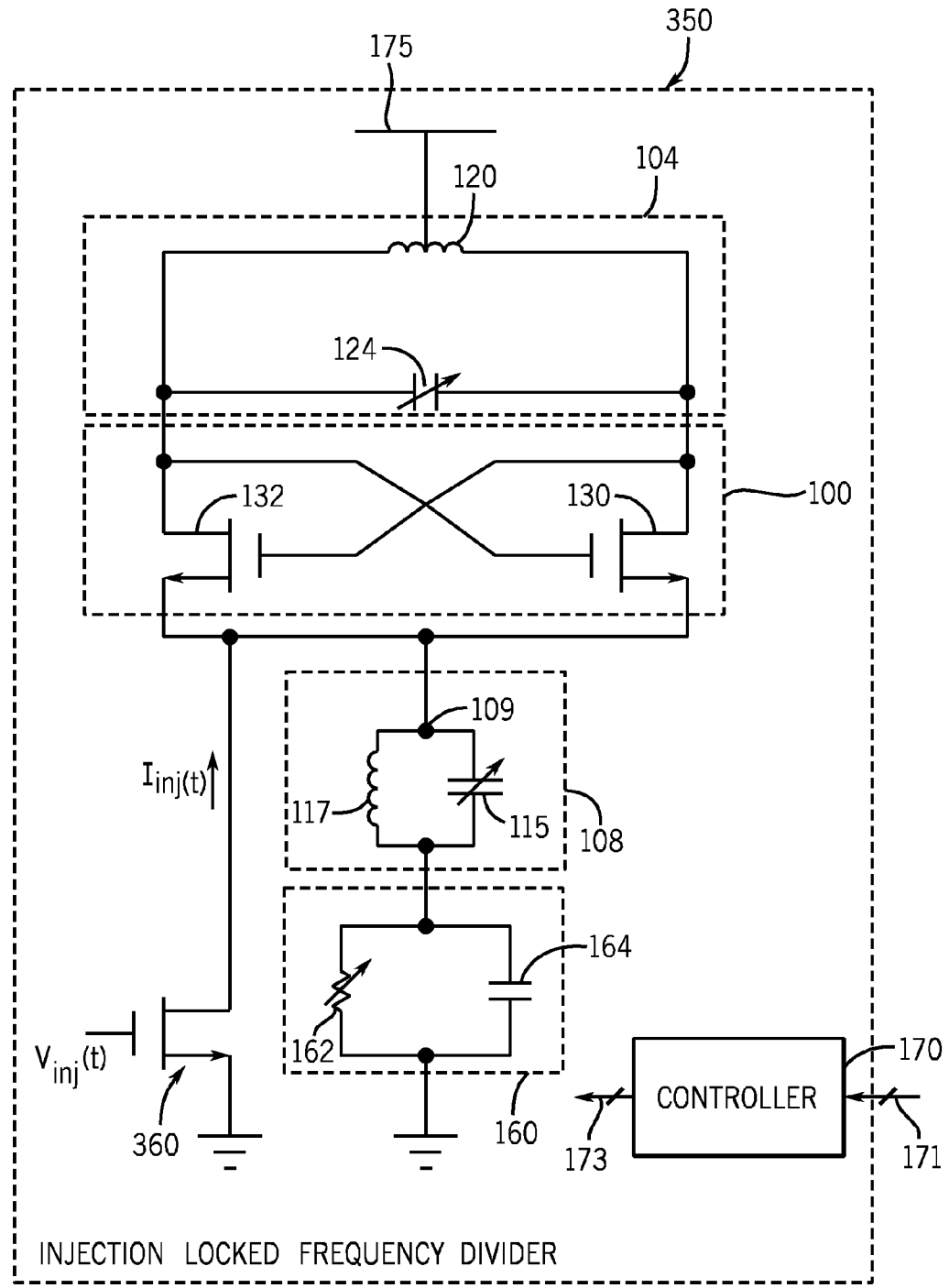

As another variation, FIG. 8 depicts an ILFD 350 in accordance with other embodiments. In general, the ILFD 350 has a similar design to the ILFD 30 of FIG. 4, with similar reference numerals being used to denote similar components. The ILFD 350 uses a transistor-based current source to introduce the $I_{inj}$ injection current. More specifically, in accordance with some embodiments of the invention, the ILFD 350 includes a MOSFET 360, which has its drain terminal coupled to the node 109; and the source terminal of the MOSFET 360 is coupled to ground. The gate terminal of the MOSFET 360 receives the periodic $V_{inj}(t)$ voltage, which therefore appears across the gate-to-source junction of the MOSFET 360 to create the corresponding $I_{inj}(t)$ injection current through the MOSFET's drain-source path.

In some embodiments of the invention, the resonance frequencies of the main 104 and tail 108 tanks may be tuned in tandem by adjusting the respective tank capacitances. For example, the tank capacitors 115 and 124 may be digitally controlled via the controller 170 such that the proper code words (communicated to the controller 170 via its input terminals 171) may be set through successive approximation, for example, at frequencies that extend into the GHz range. To satisfy the desired or specified phase noise and/or timing jitter requirements, the $I_{BIAS}$ bias current may also be programmed via a controller, such as the controller 170, such as through the use of variable resistors, as depicted for the resistors 162 in FIGS. 7 and 8. Alternatively, the $I_{BIAS}$ bias current may be regulated in other ways, such as by using an active current source, for example.

While the present invention has been described with respect to a limited number of exemplary embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. An apparatus comprising:
an injection locking frequency divider comprising a first resonant tank having a first resonance frequency and a second resonant tank having a second resonance frequency that is a harmonic of the first resonance frequency,
wherein the second resonant tank is adapted to receive a first signal at a node of the second resonant tank, the first signal having an oscillation frequency near the harmonic, to cause the first resonant tank to provide a second signal that is locked to the first signal,
wherein the injection locking frequency divider comprises cross coupled transistors coupled to the first resonant tank,
wherein the cross coupled transistors comprise source terminals that are coupled together to form a differential pair of transistors, and
wherein the second resonant tank is coupled to the source terminals.

2. The apparatus of claim 1, wherein the oscillation frequency of the first signal is a harmonic of an oscillation frequency of the second signal.

3. The apparatus of claim 1, wherein the second resonant tank is adapted to receive even harmonics of a signal provided by the first resonant tank.

4. The apparatus of claim 1, wherein the injection locking frequency divider further comprises a transformer inductively coupled to the second resonant tank to provide the first signal.

5. The apparatus of claim 1, wherein the injection locking frequency divider further comprises a current source to provide the first signal.

6. The apparatus of claim 1, wherein the injection locking frequency divider further comprises a bias circuit to provide a bias current to the second resonant tank.

7. The apparatus of claim 1, further comprising:
a locked loop circuit comprising a feedback path to incorporate the injection locking frequency divider.

8. The apparatus of claim 1, further comprising:
a frequency synthesizer to incorporate the injection locking frequency divider.

9. The apparatus of claim 1, further comprising:
a radio receiver or transmitter, wherein the radio receiver or transmitter comprises the injection locking frequency divider.

10. A method comprising:
generating an oscillation in a primary resonant tank of an oscillator to produce an output signal, the oscillation producing at least one harmonic in a secondary resonant tank of the oscillator;
injecting an input signal in a node of the secondary resonant tank to synchronize the output signal to the input signal; and
using a cross coupled differential pair of transistors between the primary and secondary resonant tanks.

11. The method of claim 10, wherein the oscillation has a first oscillation frequency, and the input signal has a second oscillation frequency that is a harmonic of the first oscillation frequency.

12. The method of claim 10, wherein injecting the input signal further comprises inductively coupling a transformer to the secondary resonant tank.

13. The method of claim 10, wherein injecting the input signal further comprises coupling a current source to the secondary resonant tank.

14. The method of claim 10, further comprising:
coupling a common mode path associated with the generating to the secondary resonant tank.

15. The method of claim 10, wherein generating the oscillation further comprises generating a signal for a frequency divider.

16. The method of claim 10, wherein generating the oscillation further comprises generating the output signal for a frequency synthesizer.

17. The method of claim 10, wherein generating the oscillation further comprises generating the output signal for a modulator or demodulator.

18. An apparatus comprising:
an injection locking frequency divider comprising a first resonant tank having a first resonance frequency and a second resonant tank having a second resonance frequency that is an even harmonic of the first resonance frequency,
wherein the second resonant tank is adapted to receive a first signal at a node of the second resonant tank, the first signal having an oscillation frequency near the harmonic, to cause the first resonant tank to provide a second signal that is locked to the first signal.

* * * * *